United States Patent
Mes

(10) Patent No.: US 7,865,685 B2
(45) Date of Patent: *Jan. 4, 2011

(54) SEMICONDUCTOR MEMORY ASYNCHRONOUS PIPELINE

(75) Inventor: Ian Mes, Nepean (CA)

(73) Assignee: Mosaid Technologies Incorporated (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/371,255

(22) Filed: Feb. 13, 2009

(65) Prior Publication Data

US 2009/0175103 A1  Jul. 9, 2009

Related U.S. Application Data

(63) Continuation of application No. 11/673,834, filed on Feb. 12, 2007, now Pat. No. 7,509,469, which is a continuation of application No. 10/855,968, filed on May 28, 2004, now Pat. No. 7,178,001, which is a continuation of application No. 10/290,317, filed on Nov. 8, 2002, now Pat. No. 6,772,312, which is a continuation of application No. 09/129,878, filed on Aug. 6, 1998, now Pat. No. 6,539,454.

(30) Foreign Application Priority Data

Apr. 1, 1998 (CA) .................................. 2233789

(51) Int. Cl.
*G06F 12/00* (2006.01)
(52) U.S. Cl. ................ 711/169; 711/105; 713/401; 365/233.1
(58) Field of Classification Search ........... 365/194, 365/230.04, 230.08, 233.1, 233.11, 233.13, 365/233.18, 233.19, 189.15, 149, 230.05; 711/105, 167, 169
See application file for complete search history.

(56) References Cited

U.S. PATENT DOCUMENTS 4,658,354 A  4/1987 Nukiyama (Continued)

FOREIGN PATENT DOCUMENTS

EP  0 704 848 A2  4/1996

(Continued)

OTHER PUBLICATIONS

Boemo, Lopez-Beudo and Meneses, "The Wave Pipeline Effect onLUT-based FPGA Architectures", Ciudad Universitario, Madrid, Spain.

(Continued)

*Primary Examiner*—Kevin L Ellis
*Assistant Examiner*—Matthew Bradley
(74) *Attorney, Agent, or Firm*—Hamilton, Brook, Smith & Reynolds, P.C.

(57) ABSTRACT

An asynchronously pipelined SDRAM has separate pipeline stages that are controlled by asynchronous signals. Rather than using a clock signal to synchronize data at each stage, an asynchronous signal is used to latch data at every stage. The asynchronous control signals are generated within the chip and are optimized to the different latency stages. Longer latency stages require larger delays elements, while shorter latency states require shorter delay elements. The data is synchronized to the clock at the end of the read data path before being read out of the chip. Because the data has been latched at each pipeline stage, it suffers from less skew than would be seen in a conventional wave pipeline architecture. Furthermore, since the stages are independent of the system clock, the read data path can be run at any CAS latency as long as the re-synchronizing output is built to support it.

11 Claims, 17 Drawing Sheets

U.S. PATENT DOCUMENTS

| | | | |
|---|---|---|---|
| 5,272,390 | A | 12/1993 | Watson, Jr. et al. |
| 5,294,842 | A | 3/1994 | Iknaian et al. |
| 5,402,388 | A | 3/1995 | Wojcicki et al. |
| 5,544,124 | A | 8/1996 | Zagar et al. |
| 5,550,784 | A | 8/1996 | Takai |
| 5,579,267 | A | 11/1996 | Koshikawa |
| 5,655,105 | A | 8/1997 | McLaury |
| 5,666,480 | A | 9/1997 | Leung et al. |
| 5,703,815 | A | 12/1997 | Kuhara et al. |
| 5,713,005 | A | 1/1998 | Proebsting |
| 5,781,499 | A | 7/1998 | Koshikawa |
| 5,784,705 | A | 7/1998 | Leung |
| 5,796,673 | A * | 8/1998 | Foss et al. ............... 365/233.1 |
| RE35,934 | E | 10/1998 | Takai |
| 5,822,255 | A | 10/1998 | Uchida |
| 5,835,443 | A | 11/1998 | Fujita |
| 5,978,884 | A | 11/1999 | Yamaguchi et al. |
| 5,999,258 | A | 12/1999 | Roberts |
| 6,014,339 | A | 1/2000 | Kobayashi et al. |
| 6,078,546 | A | 6/2000 | Lee |
| 6,539,454 | B2 | 3/2003 | Mes |
| 7,509,469 | B2 | 3/2009 | Mes |

FOREIGN PATENT DOCUMENTS

| | | |
|---|---|---|
| JP | 02-003177 | 1/1990 |
| JP | 08-096573 | 4/1996 |
| JP | 09-091955 | 4/1997 |
| JP | 09-139076 | 5/1997 |
| JP | 10-055668 | 2/1998 |
| JP | 10-188556 | 7/1998 |
| JP | 11-176158 | 7/1999 |

OTHER PUBLICATIONS

Mehrdad Heshami et al., "A 250-MHz Skewed—Clock Pipelined Data Buffer", IEEE Journal of Solid-State Circuits, vol. 31, No. 3, Mar. 1, 1998, pp. 376-383.

* cited by examiner

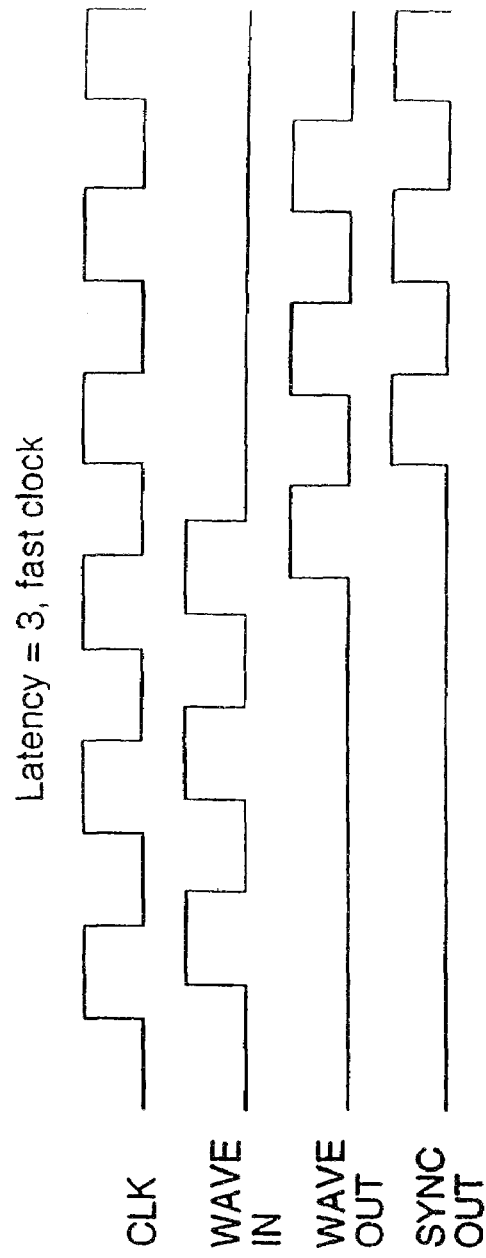
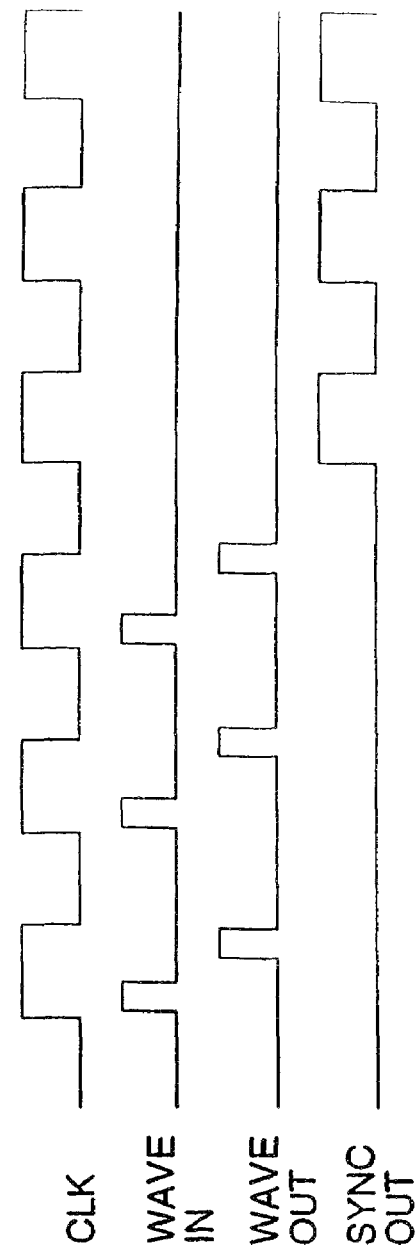
FIG.2A
PRIOR ART
FIG.2B
PRIOR ART

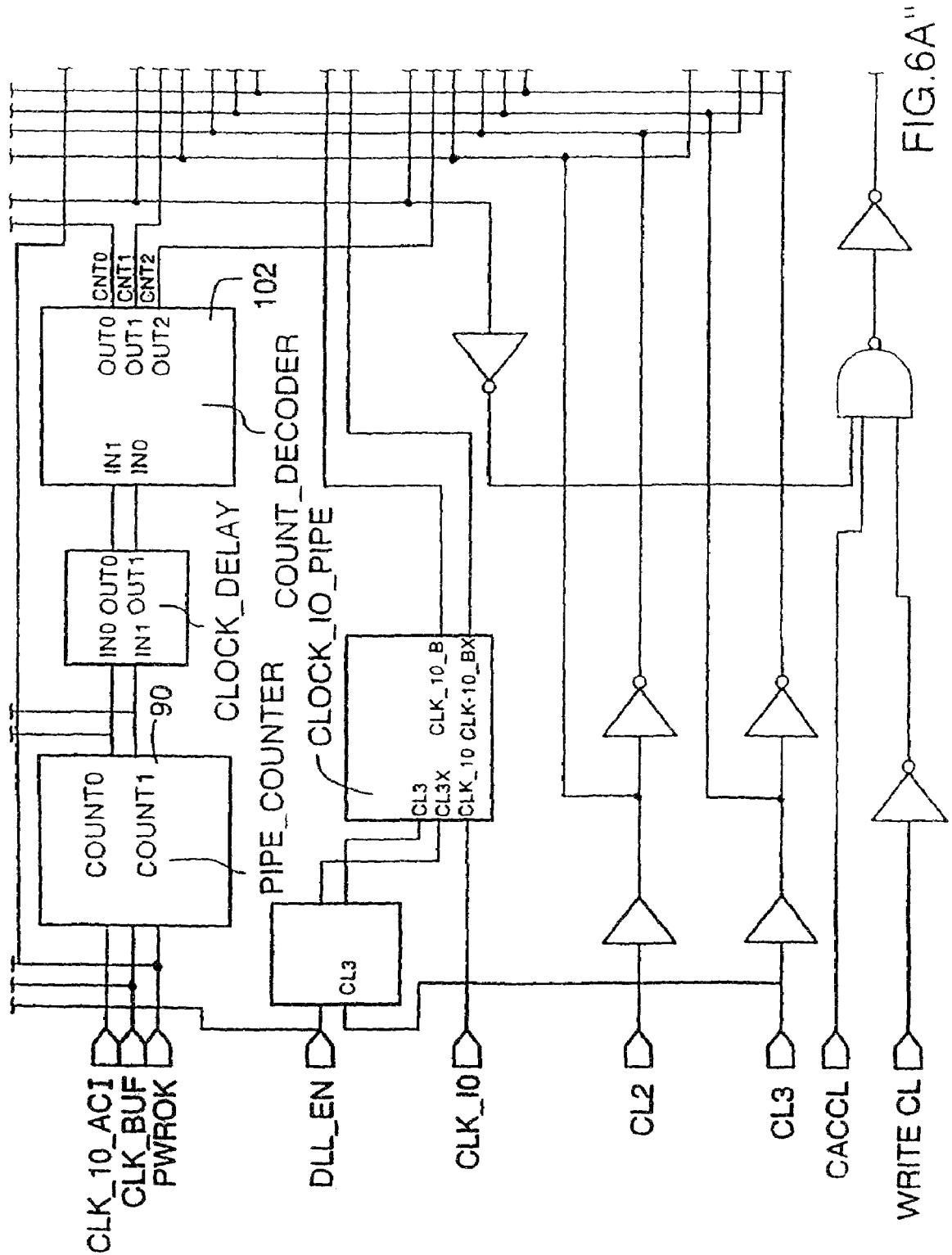

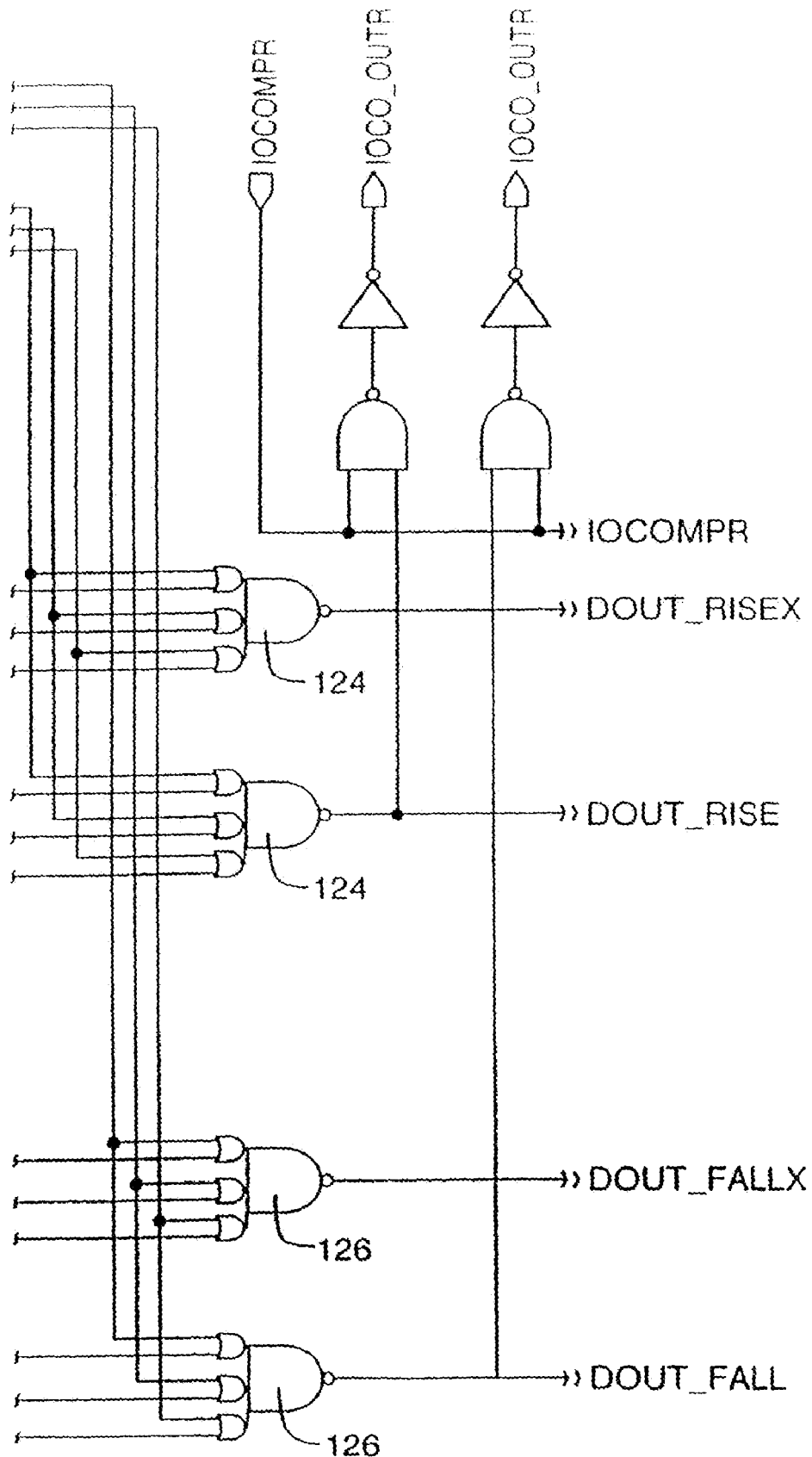
FIG.7A"

SEMICONDUCTOR MEMORY ASYNCHRONOUS PIPELINE

CROSS REFERENCE TO RELATED APPLICATIONS

This application is a Continuation Application from U.S. application Ser. No. 11/673,834, filed Feb. 12, 2007, now U.S. Pat. No. 7,509,469, which is in turn a Continuation Application from U.S. application Ser. No. 10/855,968 filed May 28, 2004 now U.S. Pat. No. 7,178,001, which is in turn a Continuation Application from U.S. application Ser. No. 10/290,317 filed Nov. 8, 2002 now U.S. Pat. No. 6,772,312, which in turn is a Continuation Application from U.S. patent application Ser. No. 09/129,878 filed Aug. 6, 1998 now U.S. Pat. No. 6,539,454, which claims priority from Canadian Application Ser. No. 2,233,789, filed Apr. 1, 1998.

FIELD OF THE INVENTION

The present invention relates to semiconductor memories and, more particularly, to a pipelined data access in a dynamic random access memory.

BACKGROUND OF THE INVENTION

In conventional non-pipelined dynamic random access memories (DRAMs) a data transfer to and from the memory is performed in sequence. That is, when a read or a write command is received and an address is made available, the data transfer according to either a read or write command is performed in its entirety before another command is accepted by the memory. This results in subsequent commands being delayed by the time it takes for the current data transfer to complete.

Historically, DRAMs have been controlled asynchronously by the processor. This means that the processor puts addresses on the DRAM inputs and strobes them in using the row address select signal ($\overline{RAS}$) and column address select signal ($\overline{CAS}$) pins. The addresses are held for a required minimum length of time. During this time, the DRAM accesses the addressed locations in memory and after a maximum delay (access time) either writes new data from the processor into its memory or provides data from the memory to its outputs for the processor to read.

During this time, the processor must wait for the DRAM to perform various internal functions such as precharging of the lines, decoding the addresses and such like. This creates a "wait state" during which the higher speed processor is waiting for the DRAM to respond thereby slowing down the entire system.

One solution to this problem is to make the memory circuit synchronous, that is, add input and output latches on the DRAM which can hold the data. Input latches can store the addresses, data, and control signals on the inputs of the DRAM, freeing the processor for other tasks- After a preset number of clock cycles, the data can be available on the output latches of a DRAM with synchronous control for a read or be written into its memory for a write operation.

Synchronous control means that the DRAM latches information transferred between the processor and itself under the control of the system clock Thus, an advantage of the synchronous DRAMs is that the system clock is the only timing edge that must be provided to the memory. This reduces or eliminates propagating multiple timing strobes around the printed circuit board.

Alternatively, the DRAM may be made asynchronous. For example, suppose a DRAM with a 60 ns delay from row addressing to data access is being used in a system with 10 ns clock, then the processor must apply the row address and hold it active while strobing it in with the ($\overline{RAS}$) pin. This is followed 30 ns later by the column address which must be held valid and strobed in with the ($\overline{CAS}$) pin. The processor must then wait for the data to appear on the outputs 30 ns later, stabilize, and be read.

On the other hand, for a synchronous interface, the processor can lock the row and column addresses (and control signals) into the input latches and do other tasks while waiting for the DRAM to perform the read operation under the control of the system clock. When the outputs of the DRAM are clocked six cycles (60 ns) later, the desired data is in the output latches.

A synchronous DRAM architecture also makes it possible to speed up the average access time of the DRAM by pipelining the addresses. In this case, it is possible to use the input latch to store the next address which the processor while the DRAM is operating on the previous address. Normally, the addresses to be accessed are known several cycles in advance by the processor. Therefore, the processor can send the second address to the input address latch of the DRAM to be available as soon as the first address has moved on to the next stage of processing in the DRAM. This eliminates the need for the processor to wait a full access cycle before starting the next access to the DRAM.

An example of a three stage column address pipeline is shown in the schematic diagram of FIG. 1(a). The column address-to-output part is a three stage pipeline. The address buffer is the first latch. The column switch is the second latch and the output buffer is the third latch. The latency inherent in the column access time is therefore divided up between these three stages.

The operation of pipelined read may be explained as follows: the column address (1) is clocked into the address buffer on one clock cycle and is decoded. On the second clock cycle, the column switch transfers the corresponding data (D1) from the sense amplifier to the read bus and column address (A2) is clocked into the address buffer. On clock three, the data (D1) is clocked into the output buffer, (D2) is transferred to the read bus and A3 is clocked into the column address buffer. When D1 appears at the output, D2 and D3 are in the pipeline behind it. For a more detailed discussion of the present technology, the reader is referred to a book entitled "High Performance Memories" by Betty Prince.

The delay in the number of clock cycles between the latching $\overline{CAS}$ in a SDRAM and the availability of the data bus is the "CAS latency" of the SDRAM. If the output data is available by the second leading edge of the clock following arrival of a column address, the device is described as having a CAS latency of two. Similarly, if the data is available at the third leading edge of the clock following the arrival of the first read command, the device is known as having a "CAS latency" of three.

Synchronous DRAMs (SDRAM) come with programmable CAS latencies. As described above, the CAS latency determines at which clock edge cycle data will be available after a read command is initiated, regardless of the clock rate (CLK). The programmable CAS latencies enable SDRAMs to be efficiently utilized in different memory systems having different system clock frequencies without affecting the CAS latency.

There are other ways to divide an SDRAM data path into latency stages. A wave pipeline is shown schematically in FIG. 1(b). A regular clocked pipeline has the disadvantage that the read latency will be equal to the delay of the slowest pipeline stage (i.e. longest delay) multiplied by the number of pipeline stages. A clocked pipeline with adjusted clocks uses clock signals that have been adjusted to each pipeline stage so that longer pipeline stages may be accommodated without impacting the read latency. A longer pipeline stage will be ended with a clock that is more delayed than the clock that starts the pipeline stage. A shorter pipeline stage will be started with a clock that is more delayed than the clock that ends the pipeline stage. A disadvantage of this scheme is that different adjustments to the clock are needed for each CAS latency supported by the chip. Also, architecture changes can have a large impact on the breakdown of the latency stages, requiring designers to readjust all the clocks to accommodate the new division of latency stages.

Furthermore there are a limited number of places where a latency stage can be inserted without adding extra latency or chip area. Multiple latency stages have a disadvantage in that not all latency stages will be equal in the time needed for signals to propagate through the stage. Another complication is the need to enable or disable latency stages depending on the CAS latency at which the chip has been programmed to operate.

In the wave pipeline of FIG. 1(b) runs pulses of data through the entire read data path. A wave pipeline relies on an ideal data path length, that is it assumes that all data paths are equal. However, data retrieved from certain memory cells in a memory array. will be inherently faster than data retrieval from other memory cells. This is primarily due to the physical location of the memory cells relative to both the read in and read out data path. Thus data must be resynchronized before being output from the chip. This data path skew makes it difficult to safely resynchronize the retrieved data in a wave pipeline implementation.

If address signals are applied to a data path with a cycle time which exceeds the memory access time, then the data which is read from the memory is not output during the inherent delay of the memory core. In other words, in the wave pipeline technique address input signals are applied with a period, which is less than the critical path of the memory core section.

Furthermore as illustrated in FIGS. 2(a) and 2(b) with a slow clock it is necessary to store the output data of the wave pipeline until the data is needed.

SUMMARY OF THE INVENTION

The present invention thus seeks to mitigate at least some of the various disadvantages described with respect to the current art.

In accordance with this invention there is provided pipelined SDRAM comprising:

(a) a memory core;

(b) a read path, defined between an address input port and an I/O data output port;

(c) a plurality of pipeline stages located in said read path, each controlled by a corresponding one of a plurality of asynchronous control signals;

(d) a timing delay element for generating said asynchronous control signals;

(e) latches associated with each of said plurality of pipeline stages responsive to said asynchronous control signal to latch data at each of said stages; whereby data is latched at every pipeline stage independent of said system clock.

In accordance with a further aspect of this invention the asynchronous control signals are generated within the chip and optimized to the different latency stages.

A still further aspect of the invention provides stages that are independent of the system clock thereby allowing the read data path to be run at any CAS latency which may be supported by a suitable resynchronizing output.

A still further aspect of the invention provides for a synchronization circuit coupled to the end of the read data path for synchronizing the output data to a system clock.

BRIEF DESCRIPTION OF THE DRAWINGS

A better understanding of the invention will be obtained by reference to the detailed description below in conjunction with the following drawings in which:

FIGS. 2(a) and 2(b) are timing waveforms for a SDRAM having a CAS latency of 3 running under fast and slow clock conditions respectively;

DETAILED DESCRIPTION

Figure 1A:
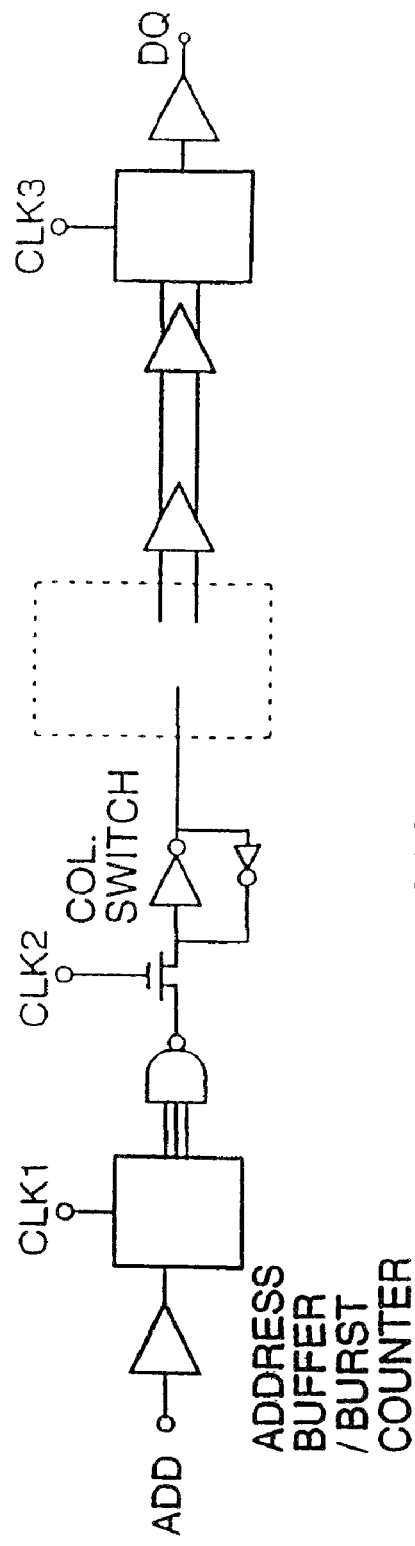
FIG. 1(a) is a schematic diagram of a conventional clocked pipeline memory circuit.
Figure 1B:
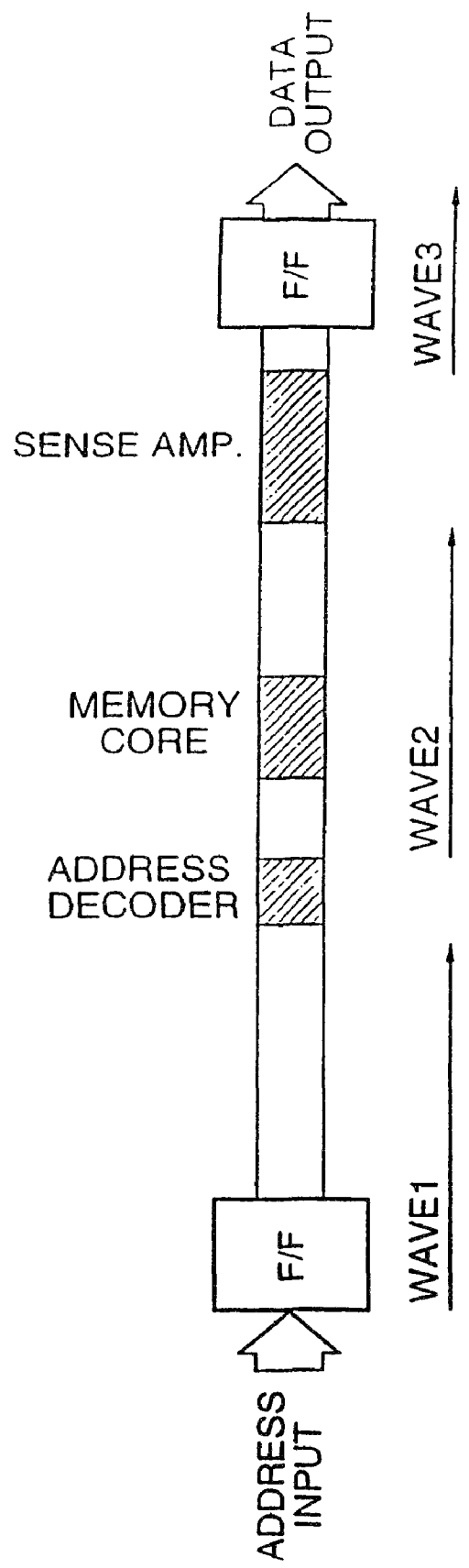
FIG. 1(b) is a schematic diagram of a conventional wave pipeline memory circuit.
Figure 3:
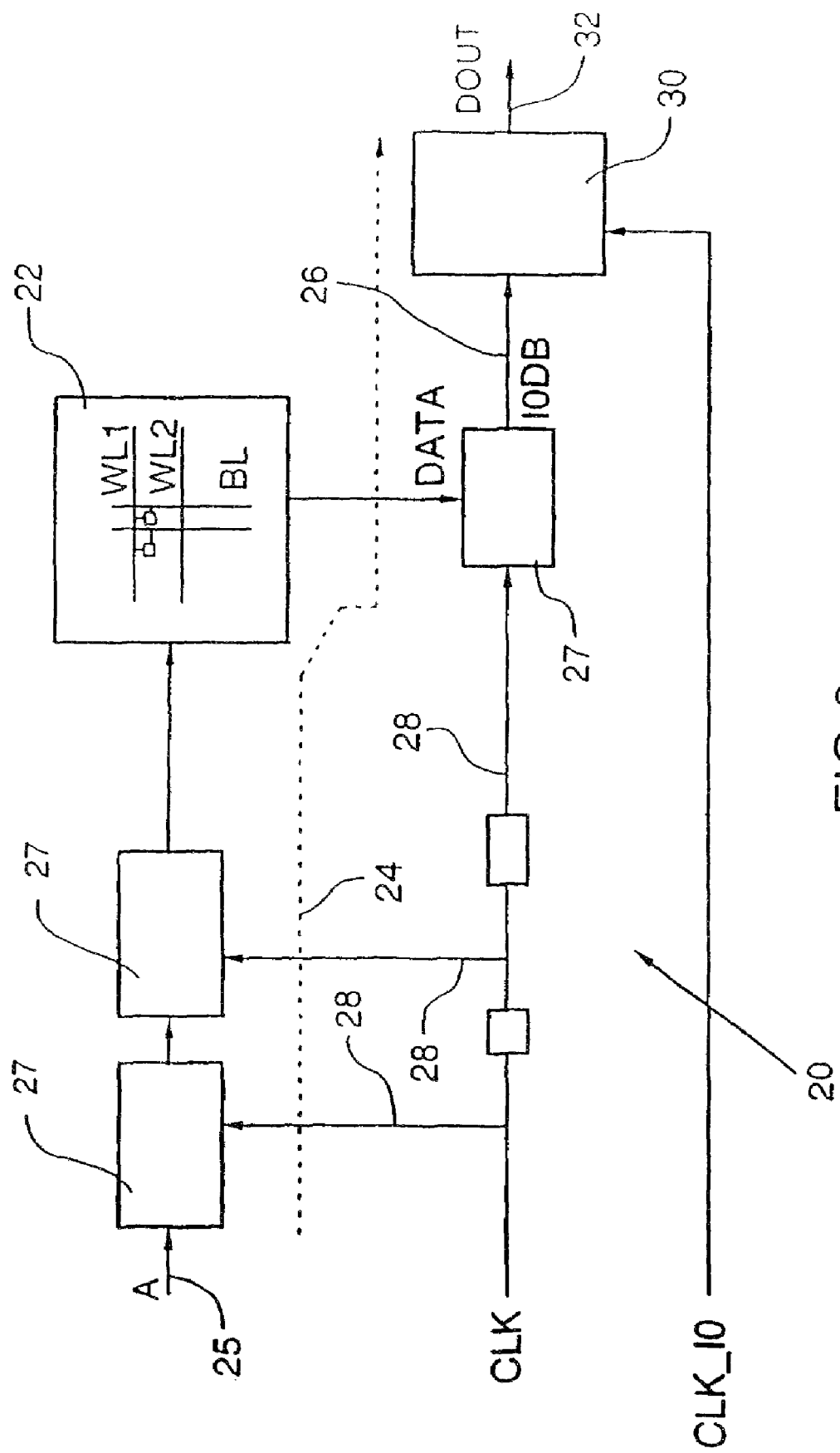
FIG. 3 is a schematic diagram of a generalized embodiment of the present invention.

In the following discussion, like numerals refer to like elements in the figures and signals asserted low are indicated interchangeably with an x or an overscore associated with the corresponding signal name. Referring now to FIG. 3, a schematic diagram of a pipelined semiconductor memory according to a generalized embodiment of the invention is shown generally by numeral 20. The memory includes a core memory array 22 having a read path 24, defined between an address input port 25 and a data output 32. The read path 24 is broken up into latency stages 27, each of which is latched by respective asynchronous control signals 28. A synchronizing circuit 30 is coupled to the last latency stage of the read path in order to resynchronize the data to the system clock CLK at output 32 of the read path. The data is synchronized to the system clock CLK a predetermined number of clock cycles after the application of an address signal A to the address input 25, i.e. depending on the CAS latency of the system. The segmentation of the read path 23 into the three main latency stages, each controlled by respective control signals 28 illustrates, in general, the combining of clocked and wave pipeline techniques to achieve an asynchronous pipeline implementation according to the invention which exhibits less skew than a conventional wave pipeline but which allows for operation with any CAS latency without having to adjust individual clocks in each stage as would be required in a clocked pipeline implementation. The description with respect to FIG. 3 serves to provide an overview of the detailed circuits discussed below.

Figure 4A:
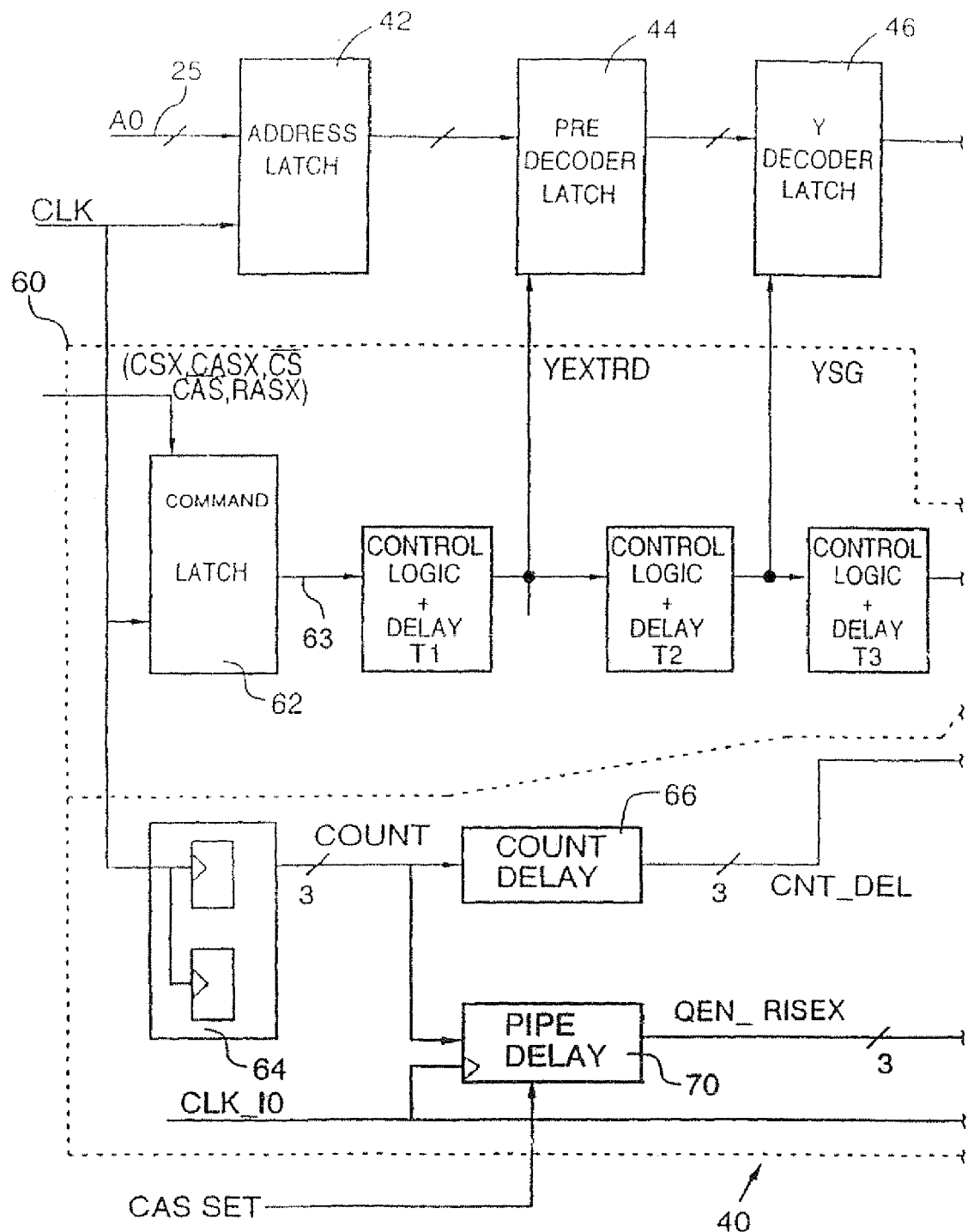
FIG. 4 is a more detailed schematic diagram of the generalized embodiment of FIG. 3.
Figure 4B:
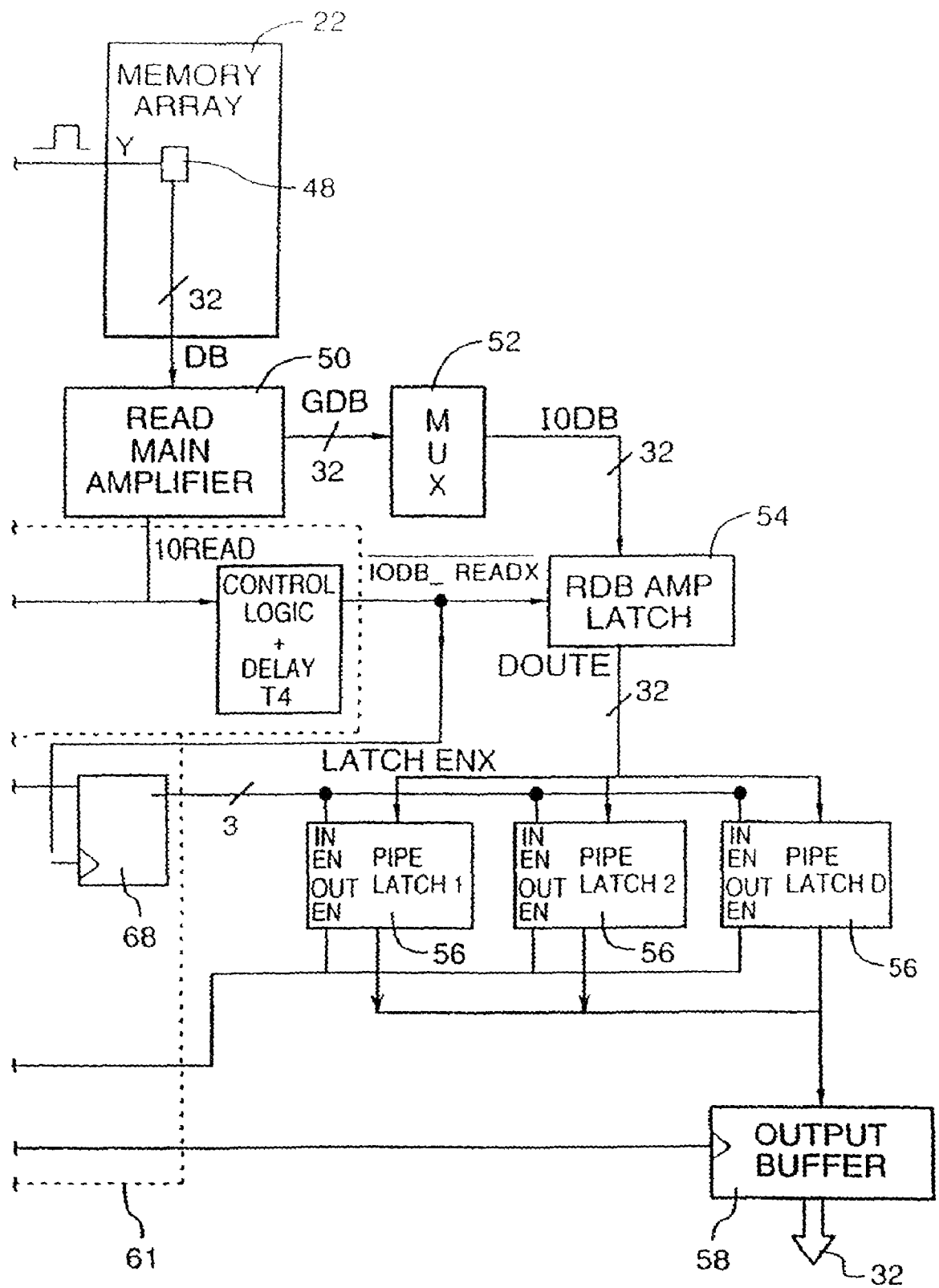

Thus, referring to FIG. 4 a detailed schematic diagram of the generalized embodiment of FIG. 3 is shown by numeral 40. The latency stages 26 in FIG. 3 include an address input latch 42, for receiving an address signal Ai at the address input port 25, the output of which is coupled to an address pre-decoder latch 44 which is in turn connected to a column address decoder latch 46. The column address decoder latch 46 decodes the address signal and is coupled to select memory cells 48 in the memory cell array 22. The column address decoder 46 activates relevant sense amplifiers (not shown) for detecting the data read out from a selected memory cell 48. The output of the sense amplifiers is coupled to a read main amplifier block 50 via a local databus DB, which is 32-bits wide in this embodiment, The output of the read main amplifier 50 is coupled to a global databus GDB. A multiplexer 52 multiplexes the GDB onto an I/O databus IODB, which is in turn coupled to a read databus amplifier RDBAMP latch block 54.

The synchronizing circuit 30 of FIG. 3 is comprised of pipe latches 56, an output buffer 58 and control circuitry shown by block 61. More specifically, the output from the RDBAMP latch is selectively coupled to the input of three pipe latches pipe_latch0, pipe_latch1 and pipe_latch2 as will be described below. The outputs from the pipe latches are connected together and coupled to the input of the output buffer 58.

The memory also includes a command latch circuit 62 having a clock input terminal coupled to the system clock CLK and a command input terminal for receiving command signals such as $\overline{RAS}$, $\overline{CAS}$, $\overline{CS}$. The command latch circuit 62 provides a first control signal 63, which is run through a series of control logic and delay elements T1 to T4. Each of the delay elements T1, T2, T3 and T4 produce respective delayed control signals that are fed to an input latch terminal of the pre-decoder latch 44, the Y decoder 46, the RMA 50 and the RDBAMP latch 54, respectively. These signals serve as individual asynchronous control signals for these circuits. On the other hand, the address latch clock input is derived directly from the system clock signal CLK.

Control of the pipe latches pipe_latch0, pipe_latch1 and pipe_latch2 is provided by the pipe latch control circuitry 61. Each pipe latch is driven by a respective pipe latch enable signal, latch_enx(0), latch_enx(1) and latch_enx(2) coupled to its latch input enable terminal. The pipe latch enable signals are derived from a pipe counter 64 which produces three count signals COUNT. The pipe counter is a free running counter which resets its count based on the total number of pipe latches. After a preset number of clock counts set by the system clock signal coupled to the pipe counter clock input terminal. The output COUNT signals from the pipe counter are coupled via count delay elements 66 to count synchronization latches 68. The outputs from the three latches 68 provide the pipe latch enable signal for clocking the appropriate pipe latch 56. The clock input enable terminal of the lathes 68 are coupled to the asynchronous control signal of the latency stage in the read path, in this case, signal IODB_READX of the RDBAMP 54 to ensure the pipe latch is latched at the appropriate time.

Alternatively, a more accurate synchronization of the data IODB_READX and the CNT_DEL signals in latch 68 can be achieved as follows:

The count delay circuitry 66 could be segmented into multiple delay stages, each receiving control logic enable signals such as YSG or Y_EXTRD. The timing relationship between the address propagation and data retrieval and the clock count delay would therefore be more closely matched.

Additionally, the output COUNT of pipe counter 64 is connected to a pipe delay element 70 for generating a pipe latch output enable signal QEN_RISEX which is connected to the respective output enable terminal of the pipe latches 56.

A CLK_IO signal which is DLL generated and slightly leads the system clock CLK, is coupled to an output enable terminal of the pipe delay and the output buffer 58. The DLL (delay locked loop) ensures that CLK_IO will enable the output buffer to properly synchronize data with the system clock edge.

Figure 5:
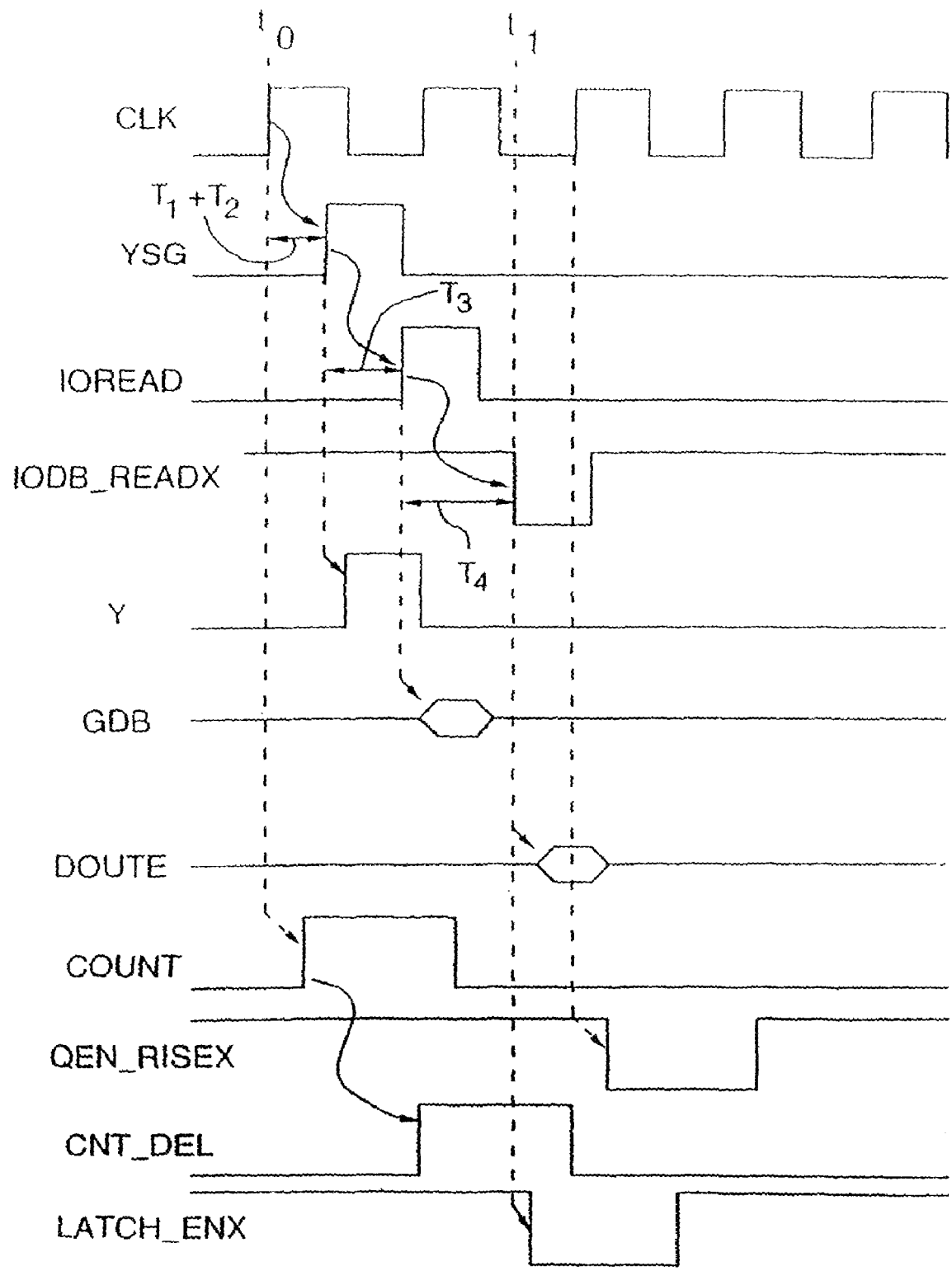
FIG. 5 is a timing waveform diagram according to a first embodiment of the present invention.
Figure 6A:
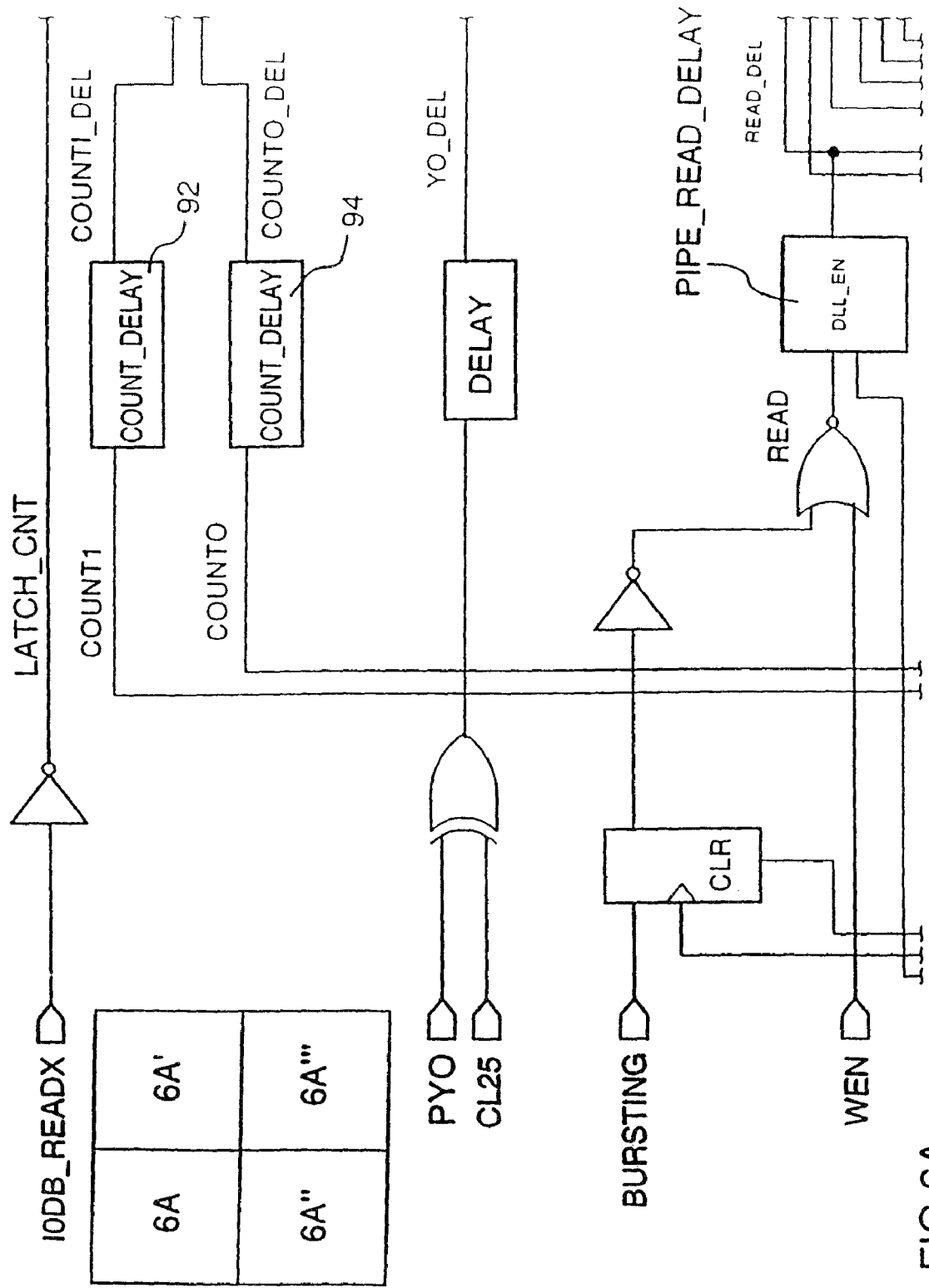
FIGS. 6(a), 6(b) and 6(c) show detailed circuit diagrams of a pipe control circuit according to an embodiment of the present invention.
Figure 6A:
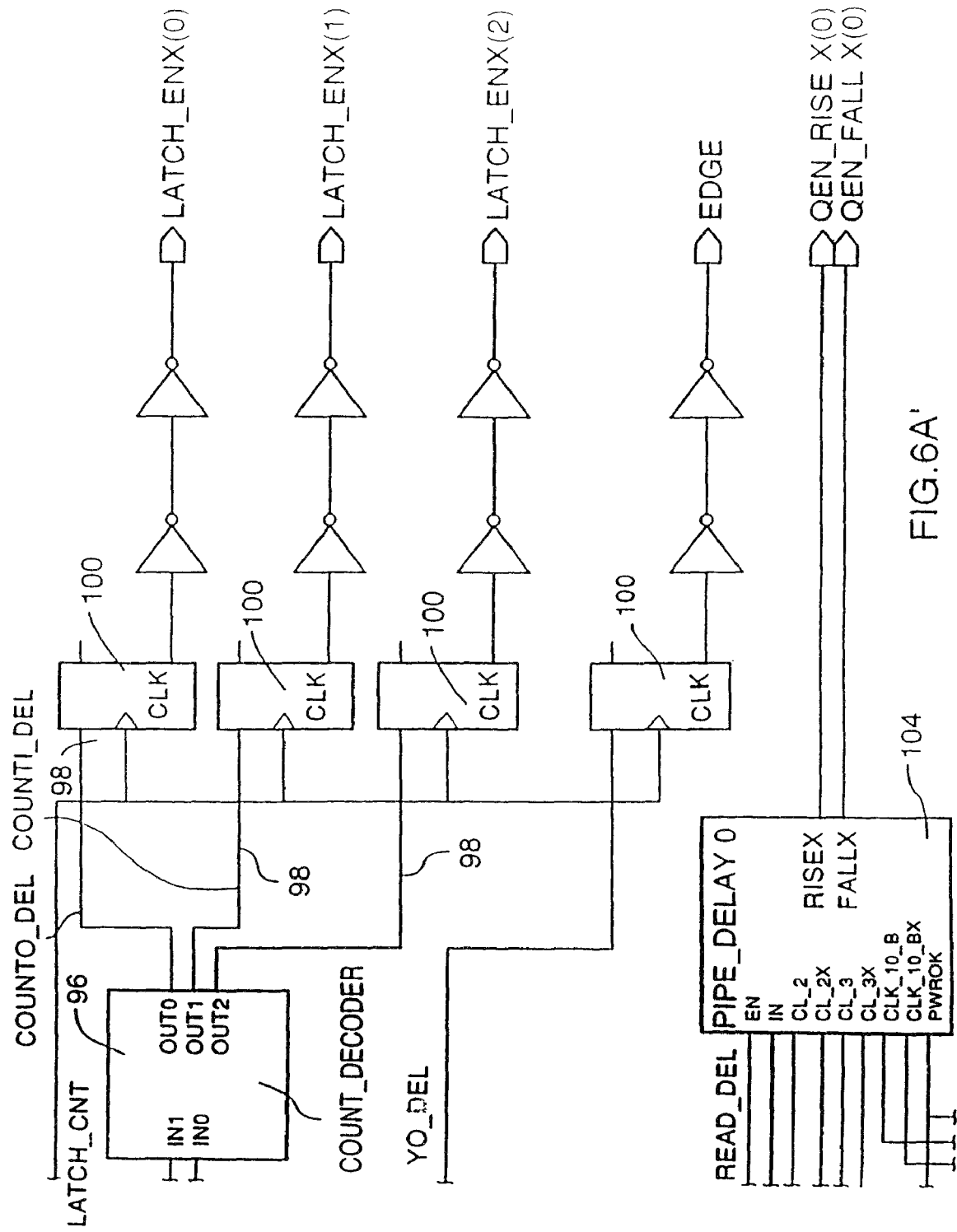
Figure 6A:
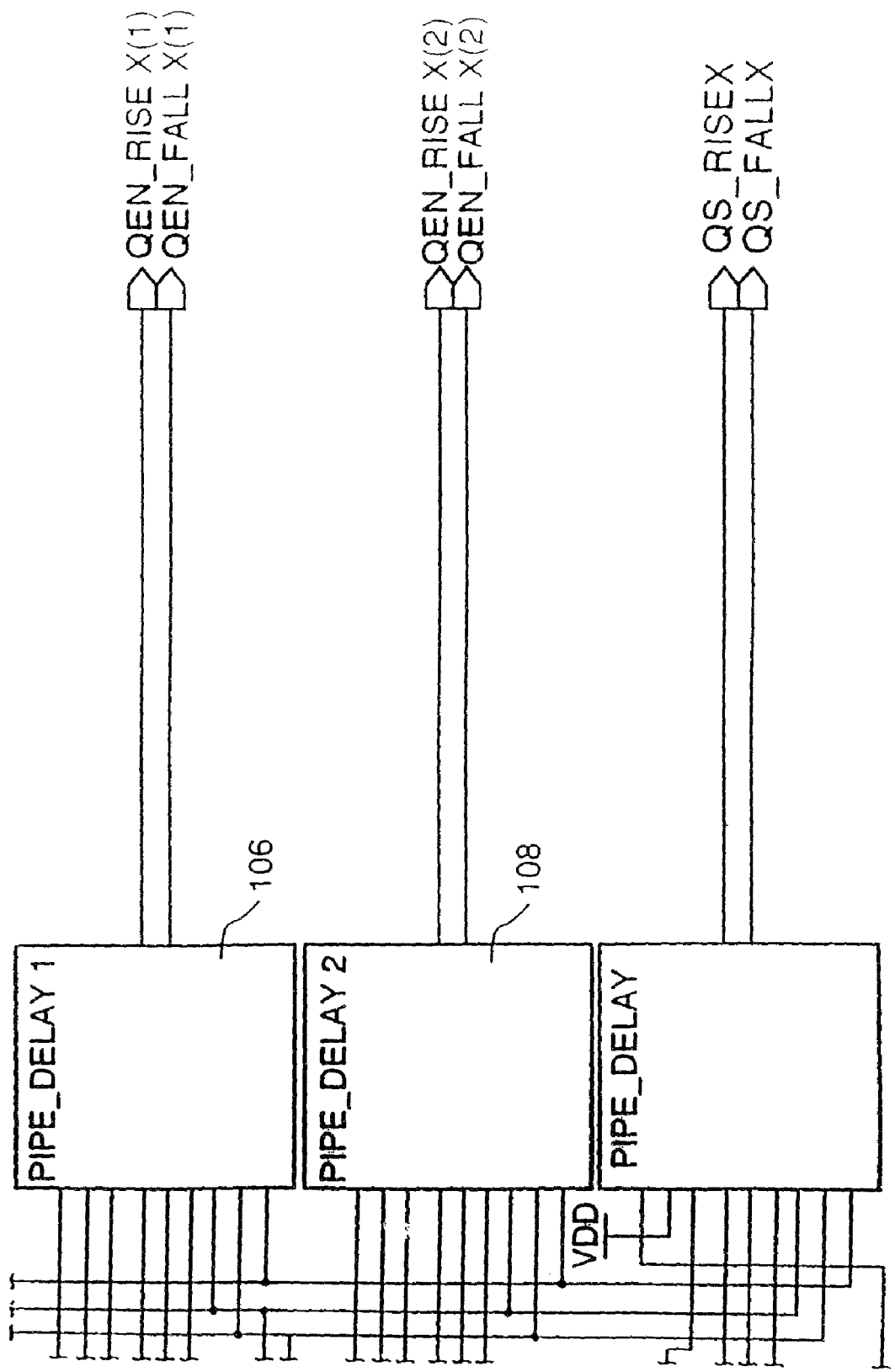
Figure 6B:
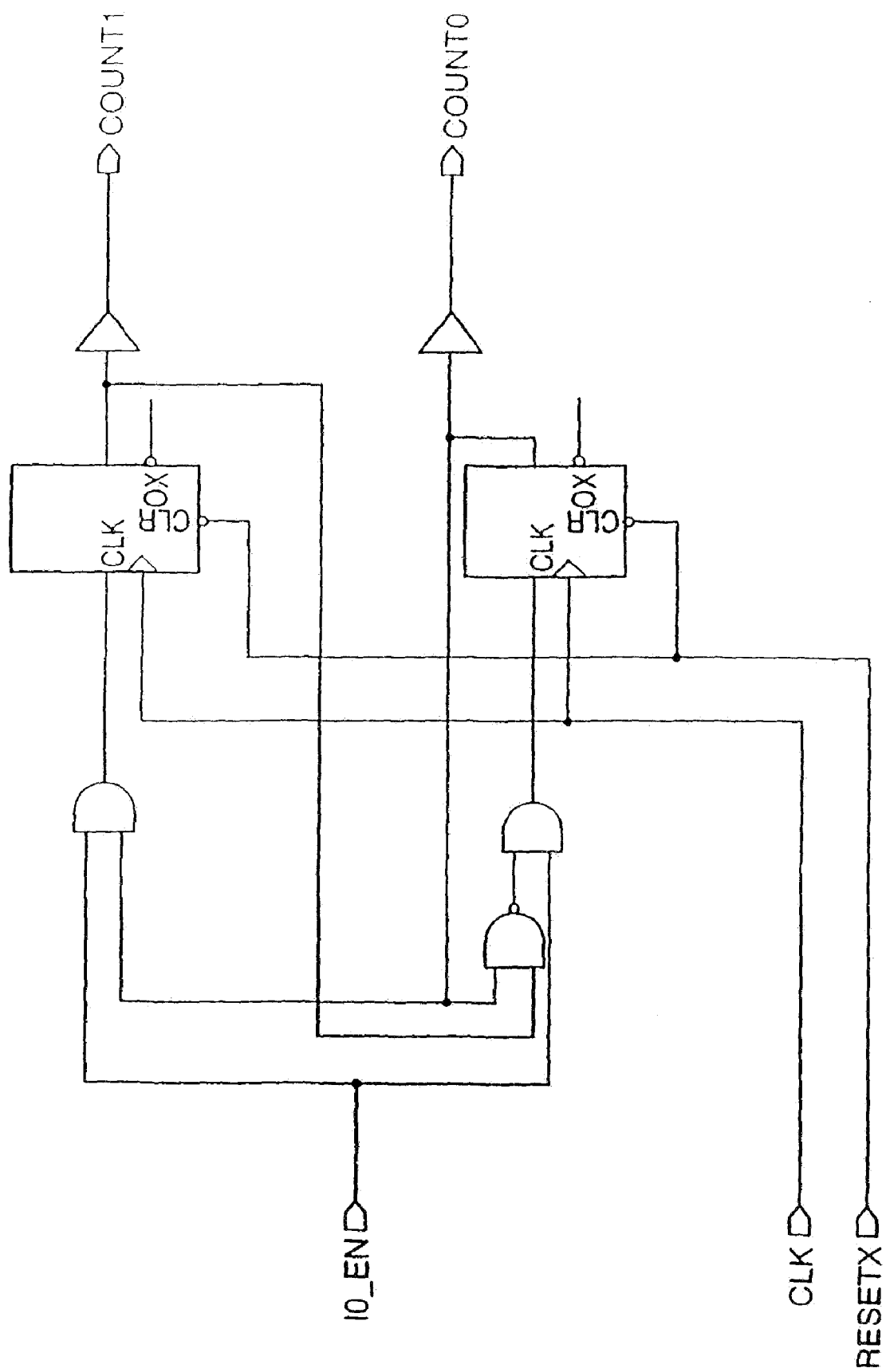
Figure 6C:
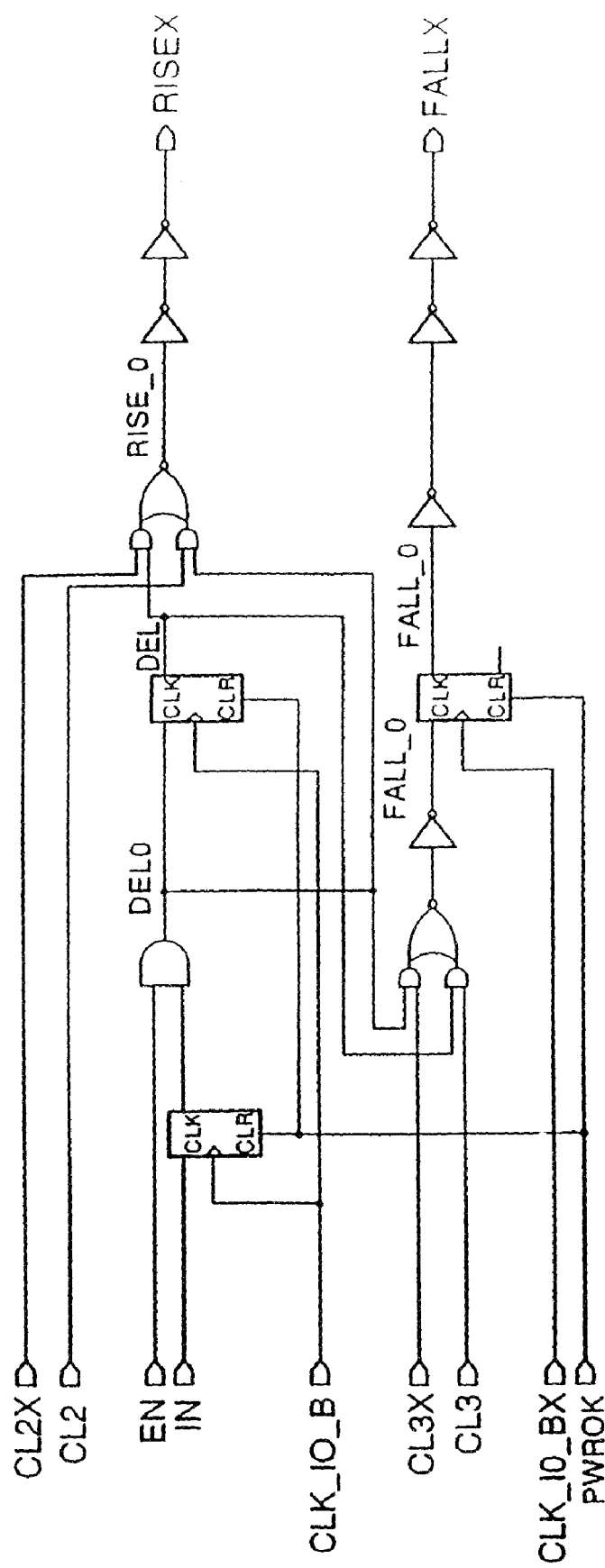

The operation of the circuit will be explained as follows with reference to the timing diagram shown in FIG. 5. At time t0 of the system clock signal CLK the address latch 42 latches the external address signal Ai, which is then free to propagate to pre-decoder latch 44 which latches the address after a delay T1 set by the delay element T1. These address signals are decoded in the Y decoder 46 and latched by the signal YSG delayed from CLK by T1 and T2. At this time the appropriate columns are activated and data is read out from the memory cells into column sense amplifiers and then latched in the RMA 50 by the IOREAD signal which is delayed from CLK by T1+T2+T3. Shortly thereafter, the data is available on the global data bus GDB. The RDBAMP 54 may now be latched at time t1 by signal IODB_READ that is delayed from IOREAD by T4, to provide the DOUTE signal.

In general as described above, these asynchronous control signals are used to control the pipeline stages. These signals control when data is read into the latch (usually a latched amplifier). Once read into the latch, data is free to propagate toward the next stage Each control signal is generated by delaying the control signal from the previous latency stage. The first stage is started by the external clock CLK. The next stage will latch data from the previous stage on the control signal that is delayed from the external clock. It may be noted that some of these delays are inherent in the circuits used to control whether a read is to take place, while some of the delays are deliberately added using timing delay elements. These are usually comprised of buffers sized to run slowly and which may include additional resistive or capacitive elements.

Thus the delays T1 to T4 can be optimized to the particular memory independent of the external clock timing. The delay for each of these latches is selected to accommodate the propagation delays between these blocks. Thus the clock signal applied to the read main amplifier latch is synchronized and delayed from the clock signal applied to the column decoder latch to accommodate the lag in retrieving data from different areas of the memory array 22 to the read main amplifier 50.

The data once latched in the RDBAMP 54 at time t1, must as with the conventional wave pipelines, be resynchronized to the system clock CLK at the output 32 of the memory. This is accomplished as follows. The pipe latches 56 allow data to be stored in the event of fast data or a slow clock. Generally, the number of latches needed is equivalent to the number of latency stages to be supported. Each time a read is performed, a COUNT signal, one of these is shown in FIG. 5, is delayed asynchronously by the count delay element 66 and clocked by the control signal for the last stage in this case $\overline{IODB\_READ}$ into a clock synchronizing latch 68. This time delayed COUNT signal generates $\overline{LATCH\_EN}$ which determines which of the latches 56 the data from RDBAMP 54 is to be stored in. Furthermore the COUNT signal is also delayed by the appropriate number of clock cycles, as determined by the current CAS latency to which the chip is programmed. This clock delayed COUNT signal shown as $\overline{QEN\_RISE}$ in FIG. 5 controls which of the latches 56 has its output enabled to output data to the output buffer 58. Once COUNT has been set, after the delay through count delay circuitry 66, a CNT_DEL signal is generated which is combined in the clock synchronizing latch 68 with the IODB_READX signal to generate the LATCH_ENX signal. After the predetermined clock delay in the pipe delay circuit to QEN_RISEX is asserted allowing output form the latch containing the data for the appropriate clock cycle. The latches 56 work as a FIFO register, with the first data input to one of the set of latches 56, being the first data to be output from the set of latches.

Thus from the above description it may be seen that the latches in the read path, segment the path into latency stages of an asynchronous pipeline. The chip architecture and the maximum operating frequency determine the number and placement of these stages. In general, a higher operating frequency will require a large number of shorter pipeline stages. Other techniques can be used such as doubling the number of data paths in a stage and alternating between the data paths. For example, a read output from the sense amplifiers is alternated between two data buses. This is described in Mosaid U.S. Pat. No. 5,416,743. The placement of the stages will generally be dictated by the position of amplifiers or buffers, which may be converted into latches without resulting in extensive area penalty. For clarity, in the previous and following discussion latency stages refer to any circuit element capable of introducing a delay in the signal or data path.

Figure 7A:
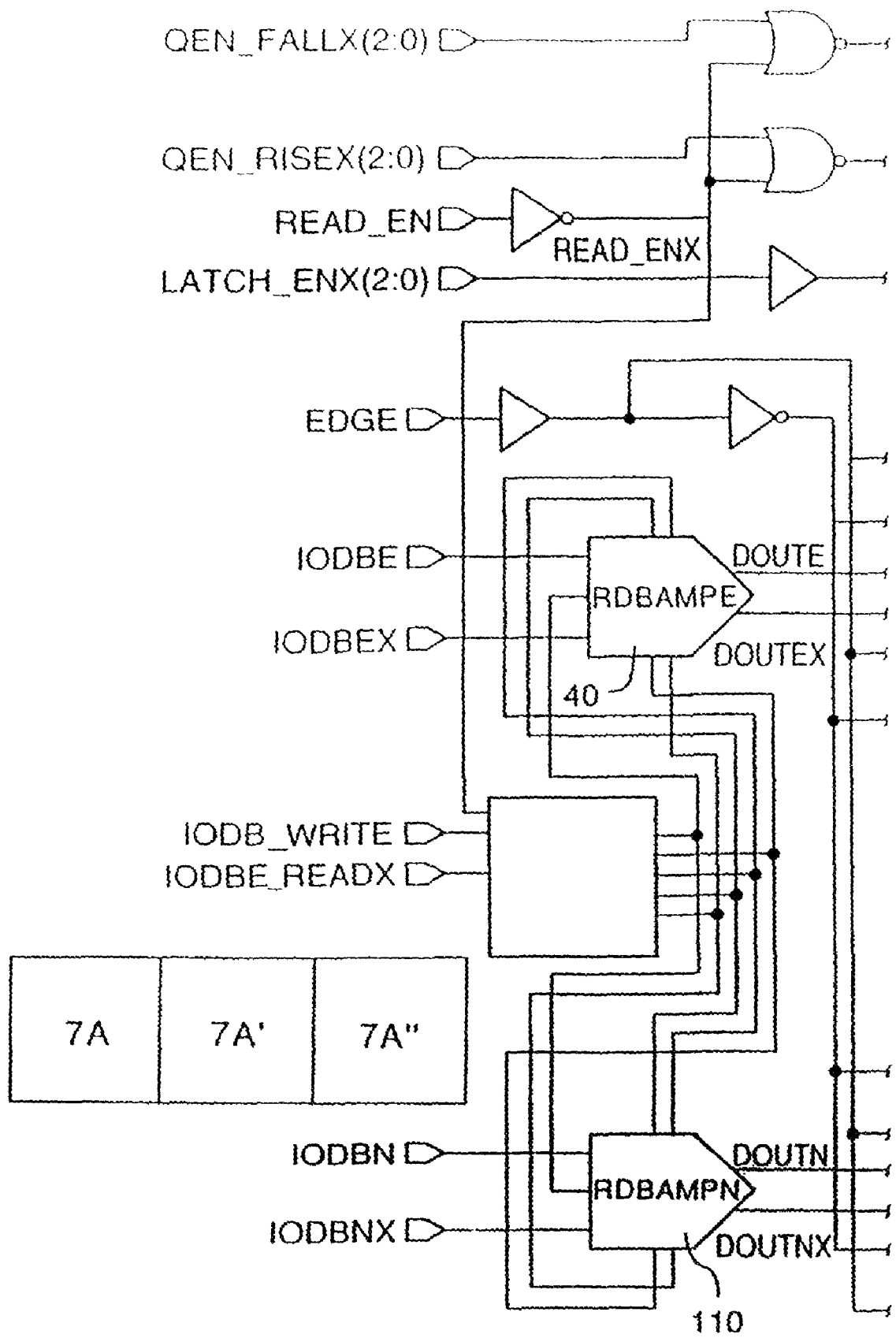
FIGS. 7(a), 7(b) and 7(c) show detailed circuit diagrams for a pipe latch and data output latch according to an embodiment of the present invention.
Figure 7A:
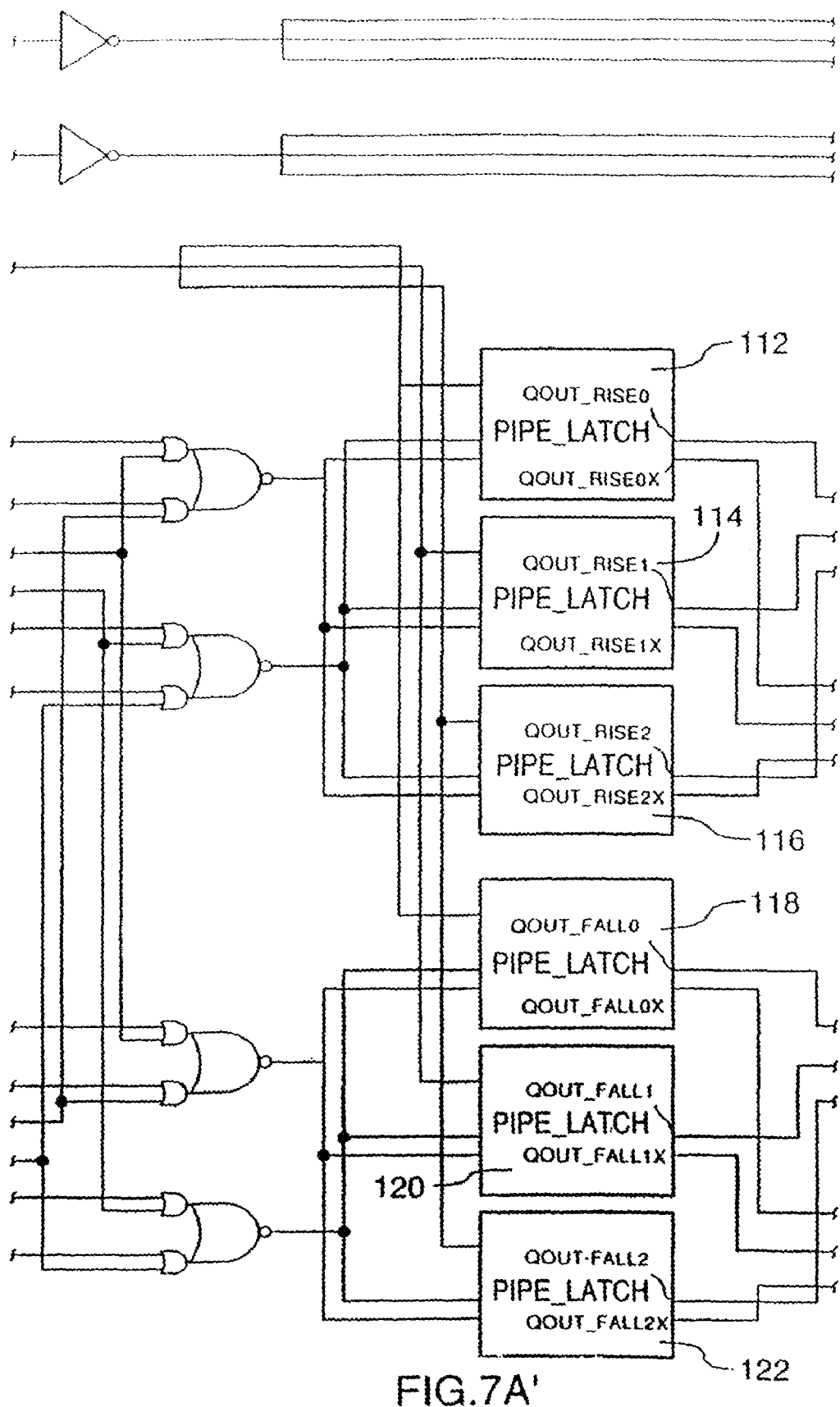
Figure 7B:
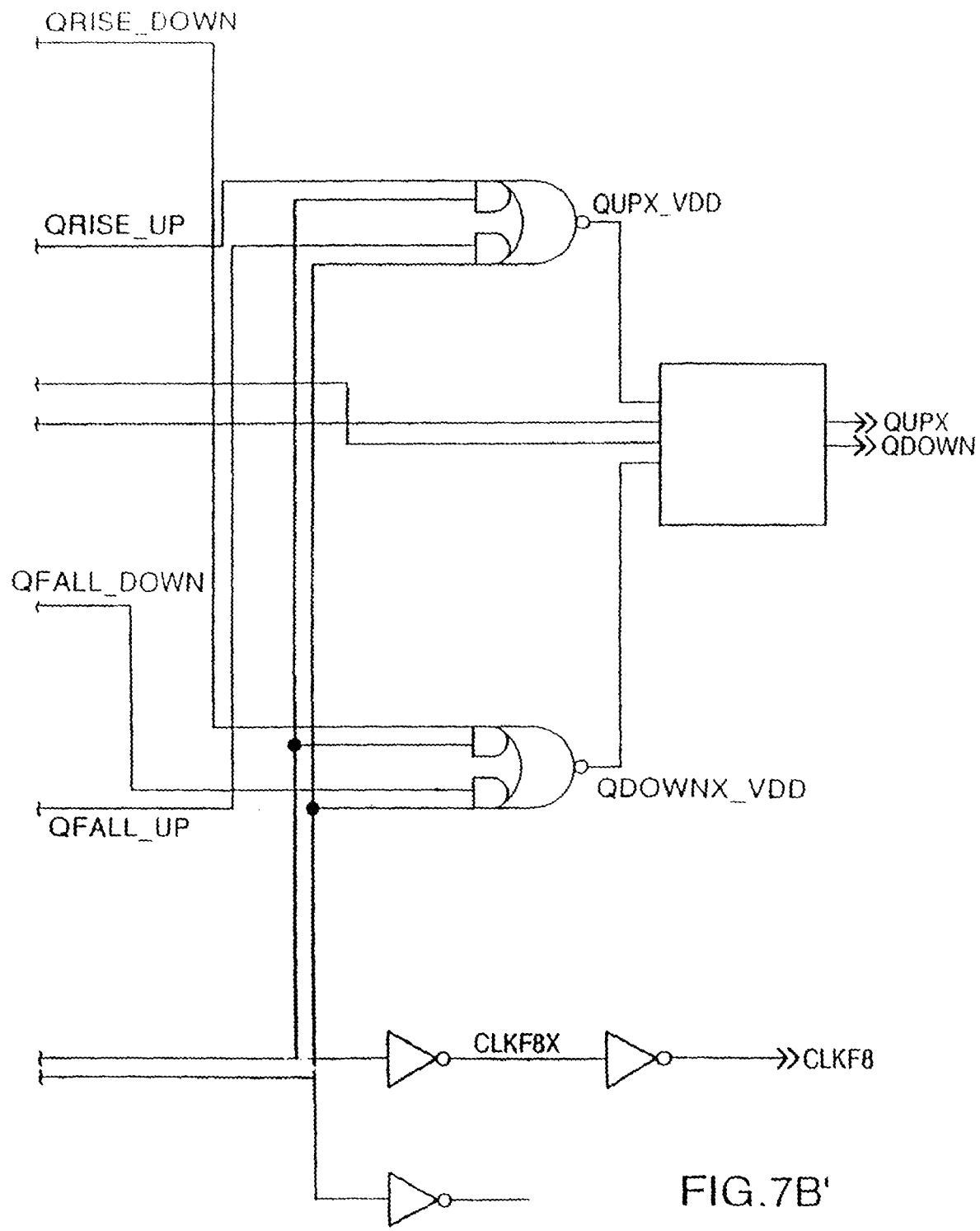
Figure 7C:
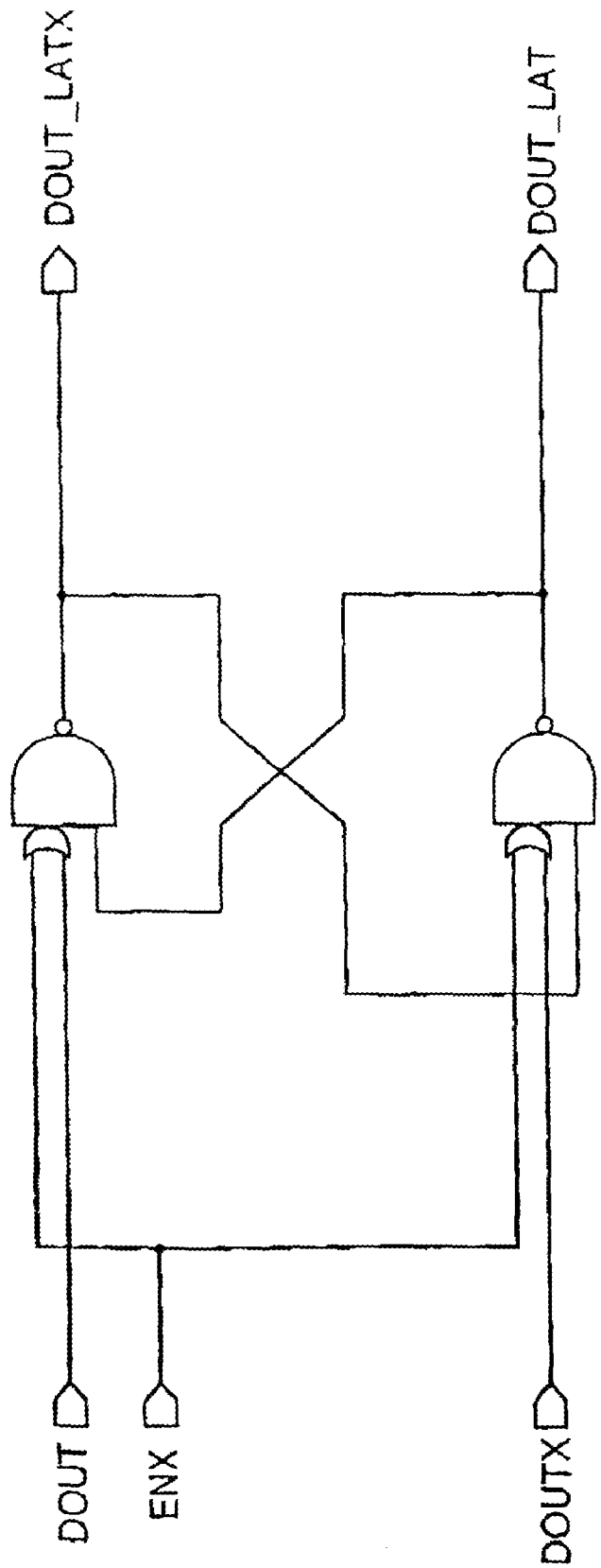
Figure 8:
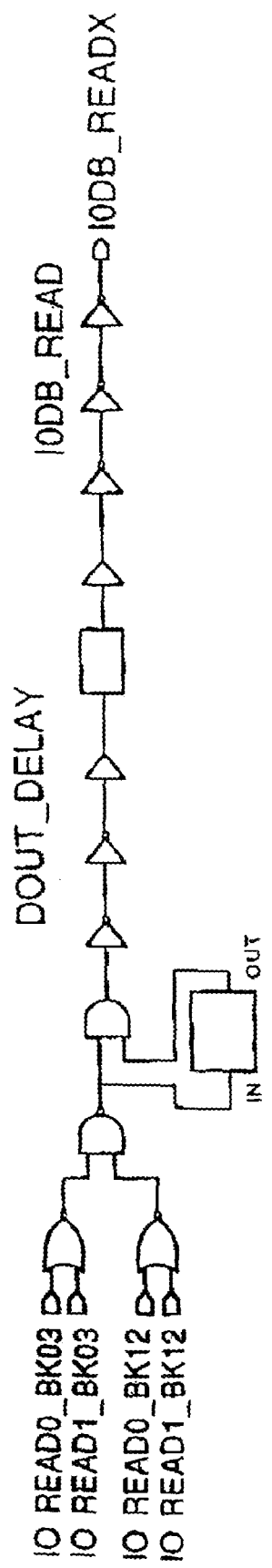
FIG. 8 is a schematic diagram of a data output control circuit according to an embodiment of the present invention.

Turning now to FIGS. 6 to 8, a detailed implementation of the generalized embodiment of FIG. 4 is shown. Accordingly, referring to FIG. 6*a*, the pipe control circuitry 61 includes a pipe counter 90, a detailed schematic of which is shown in FIG. 6*b*, for producing a two digit binary count, COUNT 0 and COUNT 1, determined by the input system clock frequency at its clock input terminal CLK. Each of the count lines, COUNT 1 and COUNT 0 are connected to respective count delay elements 92 and 94. The delayed count signals are connected to a count decoder 96 which decodes the input binary count to activate one of the three count delay lines 98, CNT0_DEL, CNT1_DEL, CNT2_DEL. The signals on these delayed count lines 98 correspond to the COUNT signal as shown in FIG. 5. In FIG. 5, all elements were shown with only one of the three components for simplicity with the exception of the three pipe latches. The delayed COUNT signals 98 are coupled to the inputs of respective clocked latches 100, the outputs of which are buffered and provide the respective latch enable signal referred to in FIG. 5, LATCH_ENX(0), LATCH_ENX(1), LATCH_EN(2). The clock input terminal of these latches 100 is coupled to the IODB_READ asynchronous control signal from the last latency stage via an inverter. The pipe counter 90 also has its output connected to a second decoder 102 also providing respective count signals, CNT 0, CNT 1 and CNT 2, which are coupled to respective pipe delay elements 104, 106 and 108. A detailed circuit diagram of the pipe delay circuit implementation is shown in FIG. 6*c*. The output of the pipe delay is controlled by a CLK_IO signal and generates the $\overline{\text{QEN\_RISE}}$ signal referred to in FIG. 5 connected to the output latch enable of the pipe latches 56. Corresponding $\overline{\text{QEN\_FALL}}$ signals are generated for the falling edge of the system clock whereas $\overline{\text{QEN\_RISE}}$ corresponds to the rising edge of the system clock.

Referring to FIGS. 7*a* and 7*b*, a detailed schematic of the pipe latches 56 and the output buffer circuitry is shown As may be seen in FIG. 7*a*, the data bits from the IODB databus are received at the input of the RDB amplifiers 110. Two RDBAMPS are shown in this implementation because of the double data rate (DDR) where data is clocked on both the rise and fall edges of the system clock. The outputs from the RDBAMPS are connected to a series of six pipe latches 112 to 122. Six latches are required instead of three due to the DDR implementation. The enable inputs of the pipe latches 112 to 122 are coupled to the respective latch enable signals derived from the circuit of FIG. 6*a*. The top three pipe latches 112 to 116 have their outputs connected to inputs of a 3 OR 2 NAND gate 124. Similarly, the bottom three latches 118 to 122 have the outputs connected to a 3 OR 2 NAND gates 126. The $\overline{\text{QEN\_RISE}}$ signal is connected to the inputs of the 3 OR 2 NAND gate 124, the output of which, when enabled, couples data to the DOUT_RISE, DOUT_RISEX input of the output buffer shown in FIG. 7*b*. As may also be seen in FIG. 7*a*, a system clock control signal EDGE is provided for directing data to the top three or bottom three latches, once again a DDR feature. Also, for a fast system clock relative to the speed of the data path the 3 OR 2 NAND gates 124 or 126 will be already on thus allowing data to pass through to the output buffer from the pipe latches. In the alternative, with a slow clock, the system receives the data and waits for the clock, thus utilizing the 3 OR 2 NAND gates 124 or 126. Turning back to FIG. 7*b*, the data output buffer 58 as shown in FIG. 4 is comprised of data output latches 130 to 136. The input enable terminals of the data output latches 130 to 136 are coupled to the CLK_IO signal for synchronizing to the correct system clock edge. A detailed circuit implementation of the pipe latches 112 to 122 is shown in FIG. 7*c*.

Thus, it may be seen that the present invention provides a flexible method for implementing a pipelined semiconductor memory, which can easily accommodate both a fast and slow system clock. Furthermore, the flexible design allows further segmentation of the read path for more precise matching of internal signals. Furthermore, various CAS latencies may be accommodated by simply delaying the output from the pipe delay element 70 to wait a specific number of clock cycles before clocking the data out.

Although the invention has been described with reference to certain specific embodiments, various modifications thereof will be apparent to those skilled in the art without departing from the spirit and scope of the invention as outlined in the claims appended hereto.

What is claimed is:

1. A pipelined synchronous dynamic random access memory (SDRAM) comprising:
   a memory core having addressable memory elements;
   a read path, defined between an address input port and a data output port; the memory core being included in the read path, the read path including a plurality of pipeline stages, each of the plurality of pipeline stages including a latch responsive to a corresponding asynchronous control signal; and
   a plurality of delay elements associated with the plurality of pipeline stages for providing the asynchronous control signals, which comprise delayed versions of a system clock signal, each of the delay elements having a latency corresponding to a latency of its associated one of the plurality of pipeline stages, such that each of the plurality of pipeline stages is controlled independently of the system clock signal.

2. The SDRAM of claim 1, further comprising a delay locked loop (DLL) circuit configured to provide a DLL clock signal in response to the system clock signal.

3. The SDRAM of claim 2, further comprising a data output buffer configured to output data in response to the DLL clock signal.

4. The SDRAM of claim 1, wherein one of the plurality of the asynchronous control signals is a gated version of the system clock signal.

5. The SDRAM of claim 4, wherein one of the plurality of delay elements is configured to gate the delayed version of the system clock as the asynchronous control signal provided from a previous one of the plurality of delay elements.

6. A pipelined double data rate synchronous dynamic random access memory (SDRAM) comprising:
   a memory core having addressable memory elements;
   a read path, defined between an address input port and a data output port, the read path comprising a data output buffer; the memory core being included in the read path, the read path including a plurality of pipeline stages, each of the plurality of pipeline stages including a latch responsive to a corresponding asynchronous control signal; and
   a plurality of delay elements associated with the plurality of pipeline stages for providing the asynchronous control signals, which comprise delayed versions of a system clock signal, each of the delay elements having a latency corresponding to a latency of its associated one of the plurality of pipeline stages, such that each of the plurality of pipeline stages is controlled independently of the system clock signal.

7. The SDRAM of claim 6, further comprising a delay locked loop (DLL) circuit having an output for providing a DLL clock signal to the data output buffer in response to the system clock signal, the data output buffer being configured to output data in response to the DLL clock signal.

8. A pipelined double data rate synchronous dynamic random access memory (SDRAM) comprising:
   a memory core having addressable memory elements;
   a read path, defined between an address input port and a data output port; the read path comprising at least one data output buffer, the memory core being included in the read path, the read path including a plurality of pipeline stages, each of the plurality of pipeline stages including a latch responsive to a corresponding asynchronous control signal; and
   a plurality of delay elements associated with the plurality of pipeline stages for providing the asynchronous control signals, which comprise delayed versions of a system clock signal, each of the delay elements comprising a control logic circuit, such that each of the plurality of pipeline stages is controlled independently of the system clock signal.

9. The SDRAM of claim 8, further comprising a delay locked loop (DLL) circuit having an output for providing a DLL clock signal to the data output buffer in response to the system clock signal, the data output buffer being configured to output data in response to the DLL clock signal.

10. The SDRAM of claim 8, wherein the control logic circuit comprised in each of the delay elements is responsive to a corresponding control signal.

11. A double data rate synchronous dynamic random access memory comprising:
   a memory core having addressable memory elements;
   a read path, defined between an address input port and a data output port, the read path including the memory core, a data output buffer and a plurality of pipeline stages, the data output buffer being coupled to a delay locked loop (DLL) circuit configured to provide a clock signal, the data output buffer outputting data in response to rising and falling edges of the clock signal, each of the plurality of pipeline stages including a latch responsive to a corresponding asynchronous control signal; and
   a plurality of delay elements associated with the plurality of pipeline stages for providing the asynchronous control signals, which comprise delayed versions of a system clock signal, each of the delay elements comprising a control logic circuit, the control logic circuit of each of the delay elements being responsive to a corresponding control signal, such that each of the plurality of pipeline stages is controlled independently of the system clock signal.

* * * * *